US007084058B2

(12) United States Patent
Ahn et al.

(10) Patent No.: US 7,084,058 B2
(45) Date of Patent: Aug. 1, 2006

(54) METHOD OF FORMING LOW-LOSS COPLANAR WAVEGUIDES

(75) Inventors: Kie Y. Ahn, Chappaqua, NY (US);
Leonard Forbes, Corvallis, OR (US)

(73) Assignee: Micron Technology Inc., Boise, ID (US)

( * ) Notice: Subject to any disclaimer, the term of this patent is extended or adjusted under 35 U.S.C. 154(b) by 241 days.

(21) Appl. No.: 09/835,643

(22) Filed: Apr. 17, 2001

(65) Prior Publication Data
US 2002/0149108 A1    Oct. 17, 2002

(51) Int. Cl.
    *H01L 21/44*    (2006.01)
(52) U.S. Cl. ............... 438/652; 438/618; 438/453; 438/427
(58) Field of Classification Search ............... 438/427, 438/627, 41, 31, 665, 622, 650, 412, 453, 438/618, 626, 630, 631, 641, 652, 653, 662; 257/751, 752, 754, 762
See application file for complete search history.

(56) References Cited

U.S. PATENT DOCUMENTS

| 4,575,700 | A | | 3/1986 | Dalman | |
|---|---|---|---|---|---|
| 5,426,399 | A | | 6/1995 | Matsubayashi et al. | |
| 5,429,978 | A | * | 7/1995 | Lu et al. | 438/387 |
| 5,447,887 | A | * | 9/1995 | Filipiak et al. | 438/644 |
| 5,849,625 | A | * | 12/1998 | Hsue et al. | 438/424 |
| 5,986,331 | A | | 11/1999 | Letavic et al. | |
| 6,140,688 | A | * | 10/2000 | Gardner et al. | 257/316 |
| 6,255,698 | B1 | * | 7/2001 | Gardner et al. | 257/369 |
| 6,259,407 | B1 | | 7/2001 | Tran | |
| 6,407,441 | B1 | | 6/2002 | Yuan | |

OTHER PUBLICATIONS

Spigel et al., Impact of Light Illumination and Passivation Layer on Silicon Finite Ground Coplanar Waveguide Transmission Line Properties, Oct. 2000, IEE Transaction on Microwave Theory and Techniques, vol. 48, No. 10, pp. 1673-1679.*

Yang et al., Characteristics of Trenched Coplanar Waveguide for High Resistivity Si MMIC Applications, May 1998, IEE Transaction on Mircrowave Theory and Techniques, vol. 46,No. 05, pp. 623-631.*

(Continued)

*Primary Examiner*—Leonardo Andujar
(74) *Attorney, Agent, or Firm*—Dickstein Shapiro Morin & Oshinsky LLP

(57) ABSTRACT

Coplanar waveguides having a deep trench between a signal line and a ground plane and methods of their fabrication are disclosed. An oxide layer is provided over a silicon substrate and a photoresist is applied and patterned to define areas where the signal line and the ground plane will be formed. A barrier layer is provided over the oxide layer in the defined areas. A metal layer is then deposited over the barrier layer. An etch mask is deposited over the metal layer for the subsequent trench formation. The photoresist and the underlying portion of the oxide and barrier layers are removed and a deep trench is formed in the substrate between the signal line and the ground plane using etching through the mask.

62 Claims, 5 Drawing Sheets

OTHER PUBLICATIONS

Hu et al., Characteristics of Trenched Coplanar Waveguide for Si MMIC Applications, Jun. 1997, IEE MTT-Digest, pp. 735-738.*

Wolf et al., Silicon Processing for the VLSI Era, 2000, vol. I, Lattice Press, 182-183.*

"Silicon Micromachined Waveguides for Millimeter-Wave and Submillimeter-Wave Frequencies" by William R. McGarth, Christopher Walker, Markus Yap, and Yu-Chong Tai, IEE Microwave and Guided Wave Letters, vol. 3, No. 3, Mar. 1993, pp. 61-63.

"Si and SiGe Millimeter-Wave Integrated Circuits" by Peter Russer, IEE Transactions on Microwave Theory and Techniques, vol. 46, No. 5, May 1998, pp. 590-603.

* cited by examiner

METHOD OF FORMING LOW-LOSS COPLANAR WAVEGUIDES

FIELD OF THE INVENTION

This invention relates to low-loss millimeter wave transmission lines and, in particular, to coplanar waveguides or ground-signal-ground lines.

DISCUSSION OF THE RELATED ART

During the past three decades, a steady progress of silicon-based integrated circuit technology brought about the advent of ULSI devices and sub-quarter micron features. Currently, such advanced technologies are increasingly finding applications in both radio-frequency (RF) electronics and sensory electronics, and these technologies are expected to combine the RF devices and sensors with ULSI on a chip for low cost fabrication processes. Silicon micro-fabrication technologies have also been applied to millimeter wave devices.

Current state-of-the-art millimeter wave devices for operating at frequencies employing signals having a wavelength of one to ten millimeters are traditionally constructed in a metal waveguide. Typical construction techniques implement the traditional dimensional milling of the metal structure. However, since the waveguide dimensions are proportional to the operating wavelength, these dimensions become smaller as the frequency increases. As the frequency of the device increases, exceeding 100 GHz, for example, the complexities of traditional fabrication and the strict tolerances required become extremely difficult to achieve. In large quantity production schemes, traditional precision milling techniques are extremely costly in achieving the precision required for devices of all types of applications.

Millimeter wave devices are typically manufactured in coplanar waveguide structures. A coplanar waveguide structure has one or more closely spaced, but separated, longitudinal coplanar signal conductors positioned transversely between, and separated from, two adjacent longitudinal coplanar ground conductors by respective gap widths. Frequency signals are carried along the facing edges of the signal to ground conductors. The ground conductors may be much wider than the gaps between signal to signal or signal to ground.

Coplanar waveguides are particularly useful because of the simplified structure provided by having both signal and ground conductors on a single plane and the resulting access to the ground planes on both sides of the signal conductor. Adjacent coplanar waveguides are known to be used to connect different flip-mounted circuits. The coplanar waveguides also provide improved isolation between signal conductors as compared to some other transmission line structures.

Millimeter wave devices manufactured as coplanar waveguide structures, however, are not practical because of the high dielectric losses due to silicon substrates as well as high conductor losses due to interconnections encountered at frequencies above 60 GHz.

SUMMARY OF THE INVENTION

The present invention provides coplanar waveguides which are more reliable and able to accommodate reduced circuitry dimensions and increased frequencies, as well as methods of forming such coplanar waveguides.

In an exemplary embodiment, a coplanar waveguide is provided having a deep trench between the signal line and the ground plane. In one embodiment, an oxide layer is provided over a substrate and a photoresist is applied and patterned to define areas for the signal line and ground plane. A barrier layer is provided over the oxide layer in the defined areas. A metal layer is deposited over the barrier layer. An etch mask is deposited over the metal layer and the photoresist, and the underlying portion of the oxide and barrier layers are removed to expose the substrate surface. An outer silicide layer is also provided to passivate the exposed metal sidewalls and a deep trench is formed at the exposed surfaces of the substrate by anisotropic etching using the etch mask. In another embodiment, isotropic etching is used to form a deep trench at the exposed surfaces of the substrate.

BRIEF DESCRIPTION OF THE DRAWINGS

The above advantages and features of the invention will be more clearly understood from the following detailed description which is provided in connection with the accompanying drawings.

DETAILED DESCRIPTION OF THE INVENTION

Exemplary embodiments of the present invention will be described below in connection with the drawings. Other embodiments may be utilized and structural or logical changes may be made without departing from the spirit or scope of the present invention. Although exemplary process conditions for forming various material layers are described below, these are only representative and are not meant to be considered as limiting the invention.

The term "substrate" used in the following description may include any semiconductor-based structure that has an exposed semiconductor surface. Semiconductor-based structure must be understood to include silicon, silicon-on insulator (SOI), silicon-on sapphire (SOS), doped and undoped semiconductors, epitaxial layers of silicon supported by a base semiconductor structure foundation, and other semiconductor structures. The semiconductor-based structures need not be silicon-based. The semiconductor could be silicon-germanium, germanium, or gallium arsenide. When reference is made to substrate in the following description, previous process steps may have been utilized to form regions or junctions in the base semiconductor or foundation.

Figure 1:
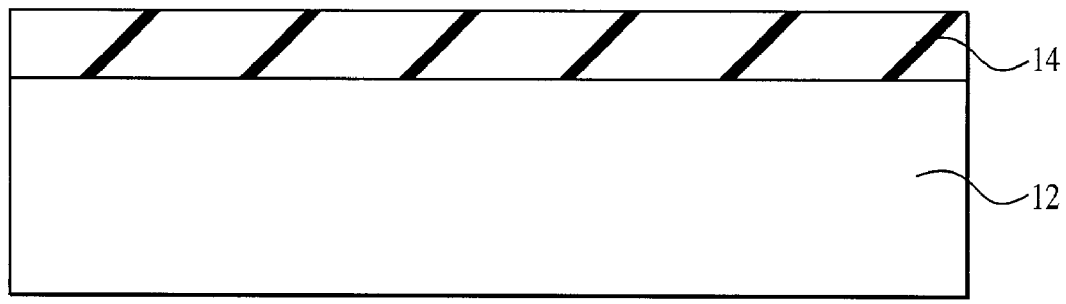
FIG. 1 illustrates a cross-sectional view of a coplanar waveguide fragment constructed in accordance with a first embodiment of the invention.

Referring now to the drawings, where like elements are designated by like reference numerals, FIGS. 1–10 illustrate embodiments of exemplary coplanar waveguides 100, 200 (FIGS. 9–10) fabricated in accordance with methods of the present invention. FIG. 1 depicts a portion of a semiconductor substrate 12 on which an insulating oxide layer 14 is formed by conventional methods of the prior art. In an exemplary embodiment of the invention, the semiconductor substrate 12 is formed of silicon (Si), and thus, reference to the semiconductor substrate 12 will be made in this application as to the silicon substrate 12. The silicon substrate 12 may have any crystalline orientation and, therefore, an advantage of the present invention is that the formation of grooves and/or channels within the silicon substrate 12 which will form the coplanar waveguides of the present invention as it will be explained in more detail below, is not restricted to a silicon substrate with <100>orientation, as in the prior art.

The oxide layer 14 (FIG. 1) may be formed by deposition, for example, to a thickness of about 200 Angstroms to about 300 Angstroms. The oxide layer 14 reduces the dielectric loss in the silicon substrate 12. Because silicon has a dielectric constant of about 12, which is high compared to that of air, which is 1, most of the electric field lines and of the electric flux appear through the silicon, and not through air. The electric field lines and the electric flux which concentrate in the silicon substrate 12 further result in high losses in the substrate. The formation of the low dielectric constant oxide layer 14 above, and in contact with, the silicon substrate 12, and below signal conductors as it will be described in detail below, minimizes the electric field and the electric flux in the conductive silicon substrate and minimizes the losses.

Figure 2:
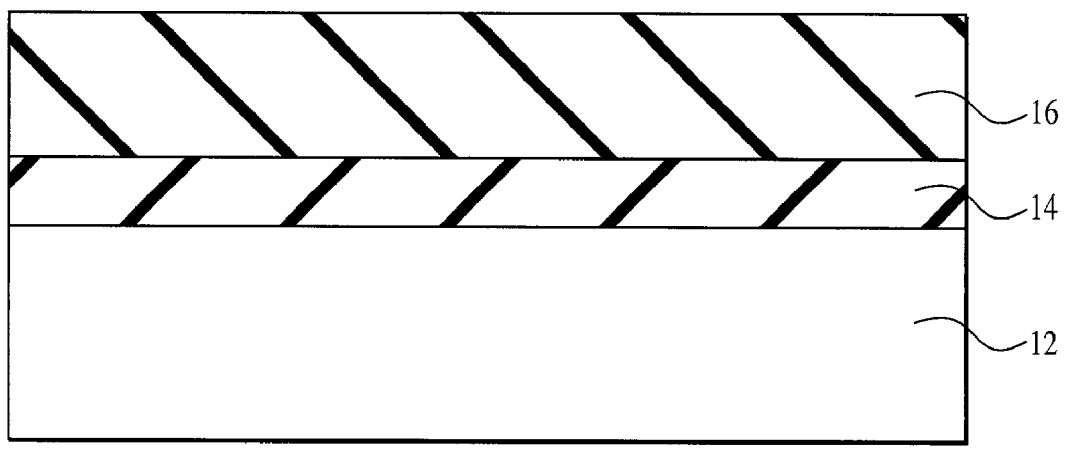
FIG. 2 illustrates a cross-sectional view of the coplanar wave guide fragment of FIG. 1 at a processing step subsequent to that shown FIG. 1.
Figure 3:
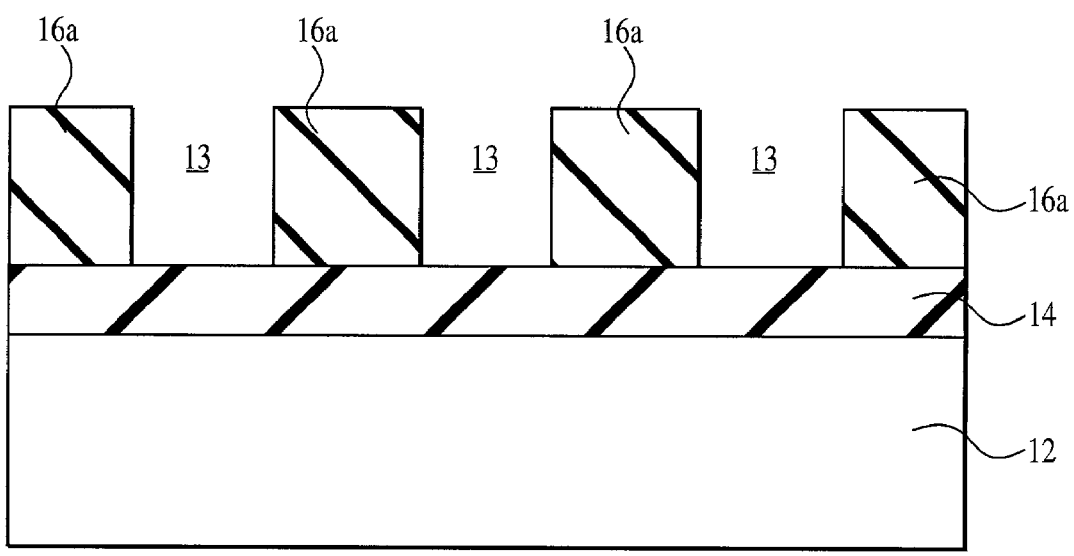
FIG. 3 illustrates a cross-sectional view of the coplanar wave guide fragment of FIG. 1 at a processing step subsequent to that shown in FIG. 2.

Referring now to FIG. 2, a thick photoresist 16 of about 300,000 Angstroms to about 500,000 Angstroms is patterned by photolithography, for example, to define openings 13 (FIG. 3) wherein signal conductor lines and ground conductor planes will be later formed, as will be described below. After the exposure and development of the exposed portions of the photoresist 16, portions 16a of the unexposed and undeveloped photoresist 16 and the openings 13 are formed over the silicon substrate 12, as shown in FIG. 3.

Figure 4:
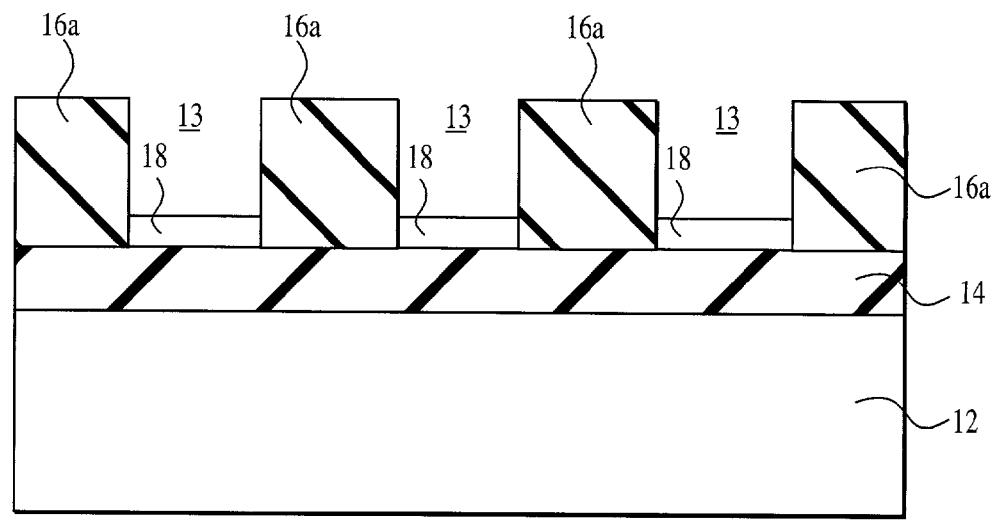
FIG. 4 illustrates a cross-sectional view of the coplanar waveguide fragment of FIG. 1 at a processing step subsequent to that shown in FIG. 3.

A lift-off metallization process is next performed by depositing a barrier layer 18 in the openings 13 (FIG. 3) and over any exposed portions of the oxide layer 14, as shown in FIG. 4. The barrier layer 18 may comprise bonding materials such as tantalum (Ta), titanium (Ti), titanium-tungsten (TiW), titanium nitride (TiN) or chromium (Cr), among others. The barrier layer 18 acts as a diffusion barrier layer and forms a strong mechanical and chemical bond between the conductive material which will be formed later and the oxide layer 14 to help prevent peeling of the formed conductive material from the oxide layer. In a preferred embodiment of the invention, the barrier layer 18 is formed of graded titanium nitride (TiN). According to this embodiment, titanium is first deposited to a thickness of about 50 Angstroms to about 100 Angstroms followed by titanium nitride deposition, by continuing evaporation of titanium in the presence of nitrogen, for example.

Figure 5:
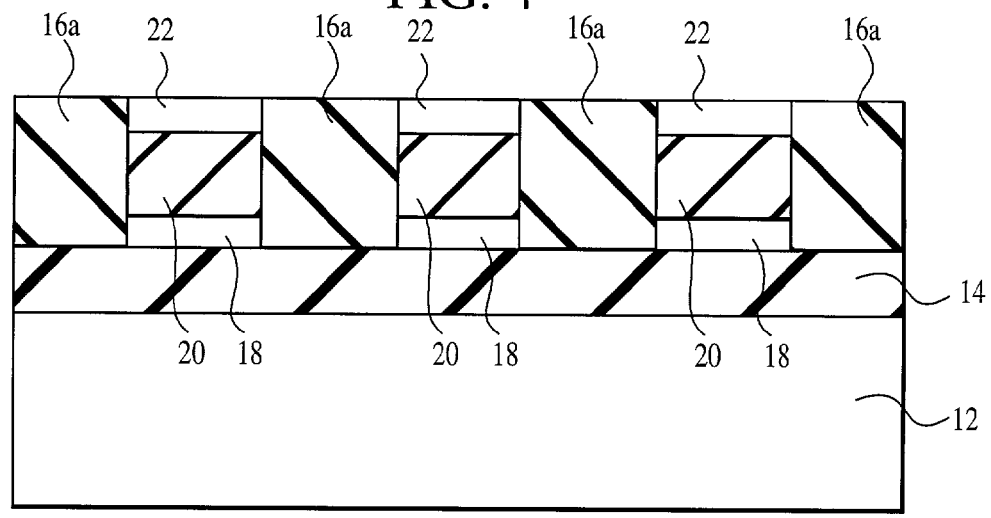
FIG. 5 illustrates a cross-sectional view of the coplanar waveguide fragment of FIG. 1 at a processing step subsequent to that shown in FIG. 4.

Next, as illustrated in FIG. 5, a conductive material 20 preferably comprising copper (Cu) is formed to a thickness of about 100,000 Angstroms to about 200,000 Angstroms to partially fill the openings 13. According to an embodiment of the present invention, the conductive material 20 is deposited by thermal evaporation at or near room temperature, for example, but other suitable methods may be employed also, as desired.

Copper (Cu) is preferred for the conductive material 20 because copper has a low electrical resistivity (1.67 micro-ohm/cm) which helps to reduce conductor loss. Copper is also preferred because its deposition near or at room temperature minimizes the grain growth and provides a smoother surface. Various studies have directly related the surface roughness of a conductive material with conductor losses. For example, the correlation between surface roughness and improvements in the RF losses has been studied by McGrath et. al. in *Silicon Micromachined Waveguides for Millimeter-Wave and Submillimeter-Wave Frequencies*, IEEE Microwave and Guided Wave Letters No. 3, p. 61 (March 1993), the disclosure of which is incorporated by reference herein. According to this study, the conductivity of the gold plating of the commercial waveguides typically employed in applications of the prior art is about $\frac{1}{10}$ that of copper, and McGrath et. al. concluded that the improvements in the gold surface are directly related to improvements in the RF losses. Thus, copper deposition at or near room temperature minimizes the grain growth and provides a smoother surface, which in turn lower the losses.

Subsequent to the deposition of the conductive material 20, a silicon oxide layer 22, of silicon dioxide ($SiO_2$) or silicon oxide (SiO), for example, is formed over the conductive material 20 to completely fill the openings 13, as also illustrated in FIG. 5. As it will be described in more details below, the top silicon oxide layer 22 is used as an etch mask during the trench formation and, thus, reference to the silicon oxide layer 22 will be also made as to the mask layer 22. The silicon dioxide layer 22 may be deposited by thermal evaporation at or near room temperature, for example, to a thickness of about 5,000 Angstroms to about 10,000 Angstroms, but other suitable methods may be employed also, as desired. Further, any excess titanium nitride, conductive material and/or silicon oxide can be removed by chemical mechanical polishing or selective etching, for example, after each successive deposition.

Figure 6:
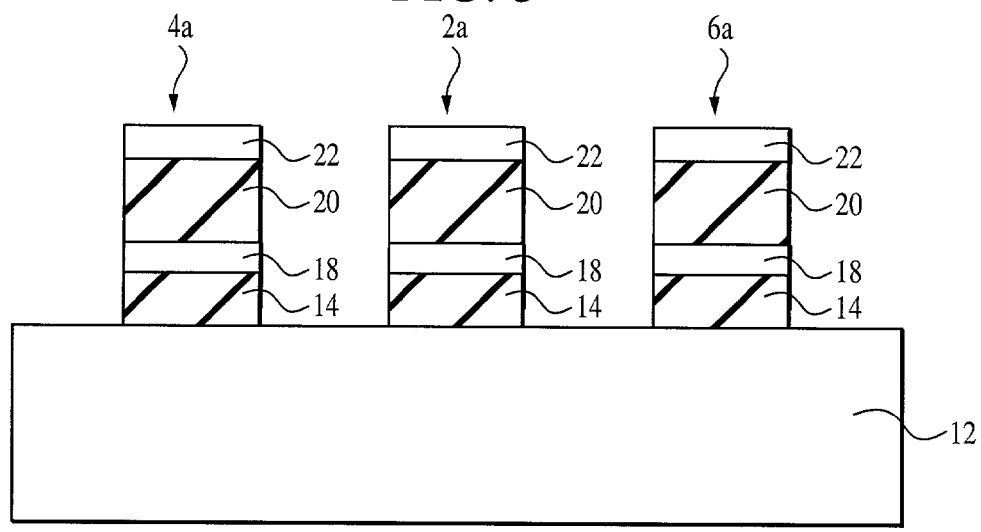
FIG. 6 illustrates a cross-sectional view of the coplanar waveguide fragment of FIG. 1 at a processing step subsequent to that shown in FIG. 5.
Figure 7:
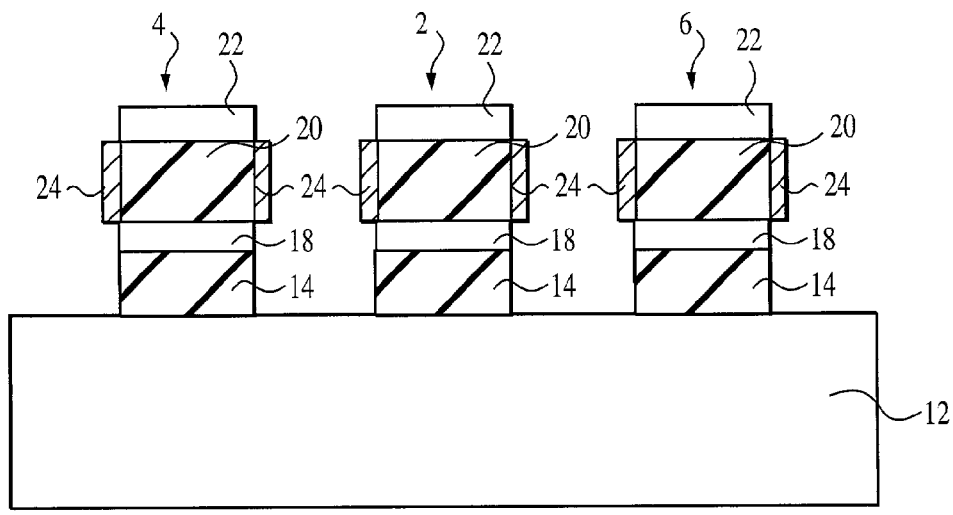
FIG. 7 illustrates a cross-sectional view of the coplanar waveguide fragment of FIG. 1 at a processing step subsequent to that shown in FIG. 6.
Figure 8:
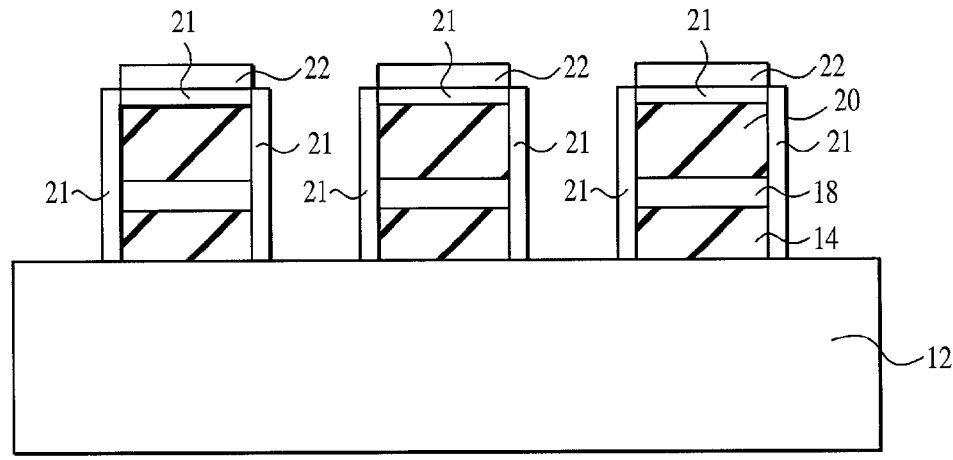
FIG. 8 illustrates a cross-sectional view of the coplanar waveguide fragment of FIG. 6 at a processing step subsequent to that shown in FIG. 6 and in accordance with a second embodiment of the present invention.

As illustrated in FIG. 6, subsequent to the formation of the conductive material 20 and of the silicon oxide layer 22, the remaining portions 16a of the photoresist 16, as well as portions of the oxide layer 14 located below the remaining portions 16a of the photoresist 16, are removed by chemicals so that structures 2a, 4a and 6a remain over the silicon substrate 12. Removal of the remaining portions 16a of the photoresist 16 and of the oxide layer 14 located below the remaining portions 16a may be accomplished by using a KOH solution, hot acetone or methylethylketone, or by flooding the silicon substrate 12 with UV irradiation to degrade the remaining portions 16a as well as the portions of the oxide layer 14 located below the remaining portions 16a. As illustrated in FIG. 6, each of the structures 2a, 4a and 6a includes portions of the oxide layer 14, the barrier layer 18, the conductive material 20 and the silicon oxide layer 22.

If copper (Cu) is employed as the conductive material 20, a thin passivation layer, in the range of about 50 Angstroms to about 100 Angstroms, may be formed to passivate any exposed copper surfaces, that is any exposed sidewalls of each of the structures 2a, 4a, 6a of FIG. 6. For this, the silicon substrate 12 may be exposed to a dilute silane at a temperature of about 300° C. to form a thin surface silicide layer 24 (FIG. 7) on each of the exposed sidewalls of the conductive material 20 of each of the structures 2a, 4a, 6a. This way, the thin surface silicide layers 24 complete the fabrication of signal conductor line 2 and that of ground conductor planes 4, 6, all illustrated in FIG. 7.

Alternatively, a thin gold (Au) layer 21 (FIG. 8) of about 10,000 Angstroms to about 20,000 Angstroms may be formed on top of the copper material 20 and on each side of the structures 2a, 4a and 6a of FIG. 6. The thin gold layer 21 of FIG. 8 may be formed toward the end of the copper deposition by electroplating, for example.

Figure 9:
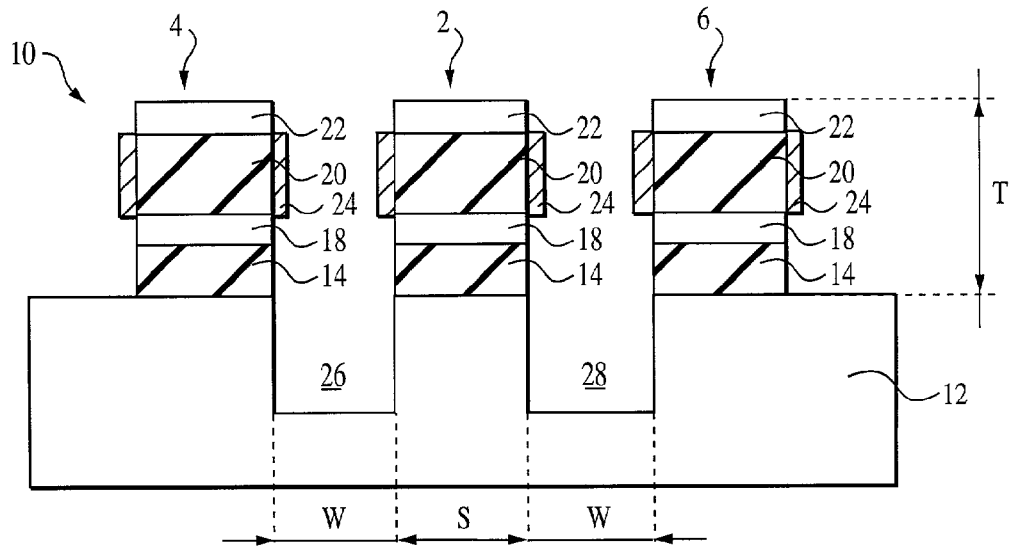
FIG. 9 illustrates a cross-sectional view of the coplanar waveguide fragment of FIG. 7 at a processing step subsequent to that shown in FIG. 7.

Referring now to FIG. 9, deep trenches 26, 28 are next formed in the silicon substrate 12 by etching, for example, to complete the fabrication of the coplanar waveguide 100. In an exemplary embodiment, anisotropic etching using the silicon oxide layer 22 as a mask is employed to etch the silicon substrate to a depth of about 100,000 Angstroms to about 200,000 Angstroms and to form the deep trenches 26 and 28, respectively. The anisotropic etchant may be, for example, potassium hydroxide, tetramethyl ammonium hydrooxide, or ethylene diamine pyrocatecol, among others. Preferably, trenches 26, 28 of FIG. 9 are formed by reactive ion etching using a deep trench etcher at an etch rate of about 2.2 μm/min.

Figure 10:
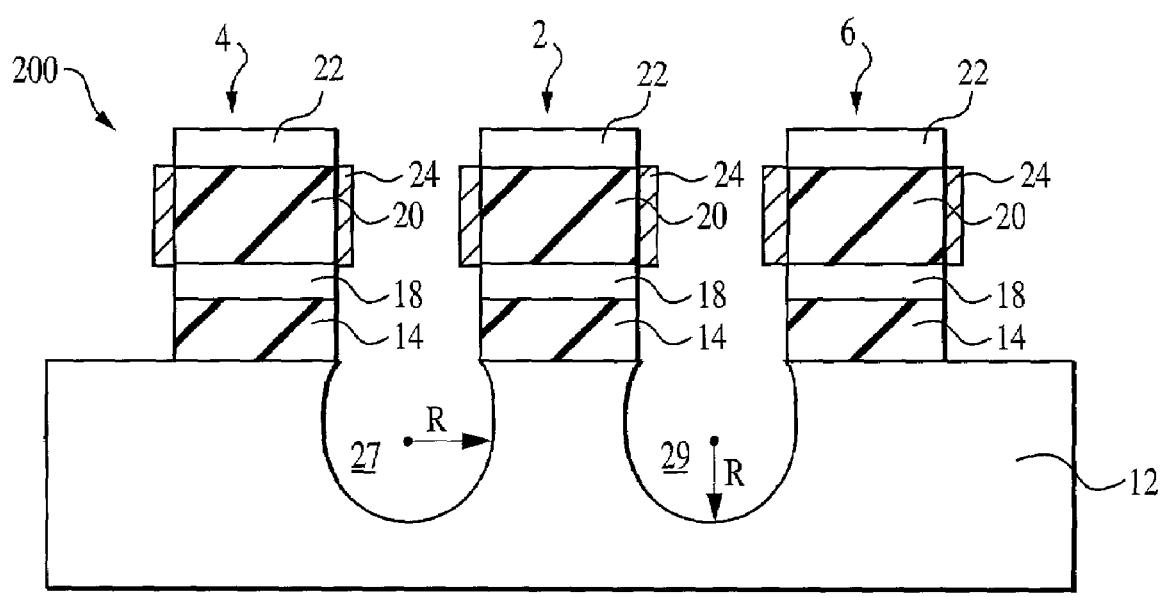
FIG. 10 illustrates a cross-sectional view of the coplanar waveguide fragment of FIG. 7 at a processing step subsequent to that shown in FIG. 9.

Alternatively, an isotropic etching such as wet etching may be employed to form trenches 27, 29, as illustrated in FIG. 10, and to complete the formation of coplanar waveguide 200. As shown in FIG. 10, each of the trenches 27, 29 has a substantially circular shape, with a radius R of about 50,000 Angstroms to about 100,000 Angstroms.

The width (FIG. 9) of the trenches 26, 28 is of about 150,000 Angstroms to about 200,000 Angstroms. The width S (FIG. 9) of the signal conductor line 2 is of about 250,000 Angstroms to about 350,000 Angstroms, and the thickness T (FIG. 9) from the top surface of the silicon oxide mask layer 22 to the top surface of the silicon substrate 12 is of about 100,000 Angstroms to about 200,000 Angstroms.

The present invention provides coplanar waveguides 100, 200 (FIGS. 9–10) having deep trenches between the signal line and the ground planes. The coplanar waveguides of the present invention are formed on a silicon substrate of any crystalline orientation and, thus, their formation is not limited to a silicon substrate of <100> orientation, as in the prior art. In addition, by using an oxide layer below the conductive material, formed preferably of copper, the electric field and the flux lines in the silicon substrate are minimized and, thus, the substrate losses are substantially reduced. Furthermore, the lift-off metallization process of the present invention for the formation of the signal conductor and ground planes reduces the number of processing steps of the prior art and eliminates the need for difficult prior art techniques, such as deposition of a polyamine and a subsequent planarization by a two-step chemical mechanical polishing.

Figure 11:
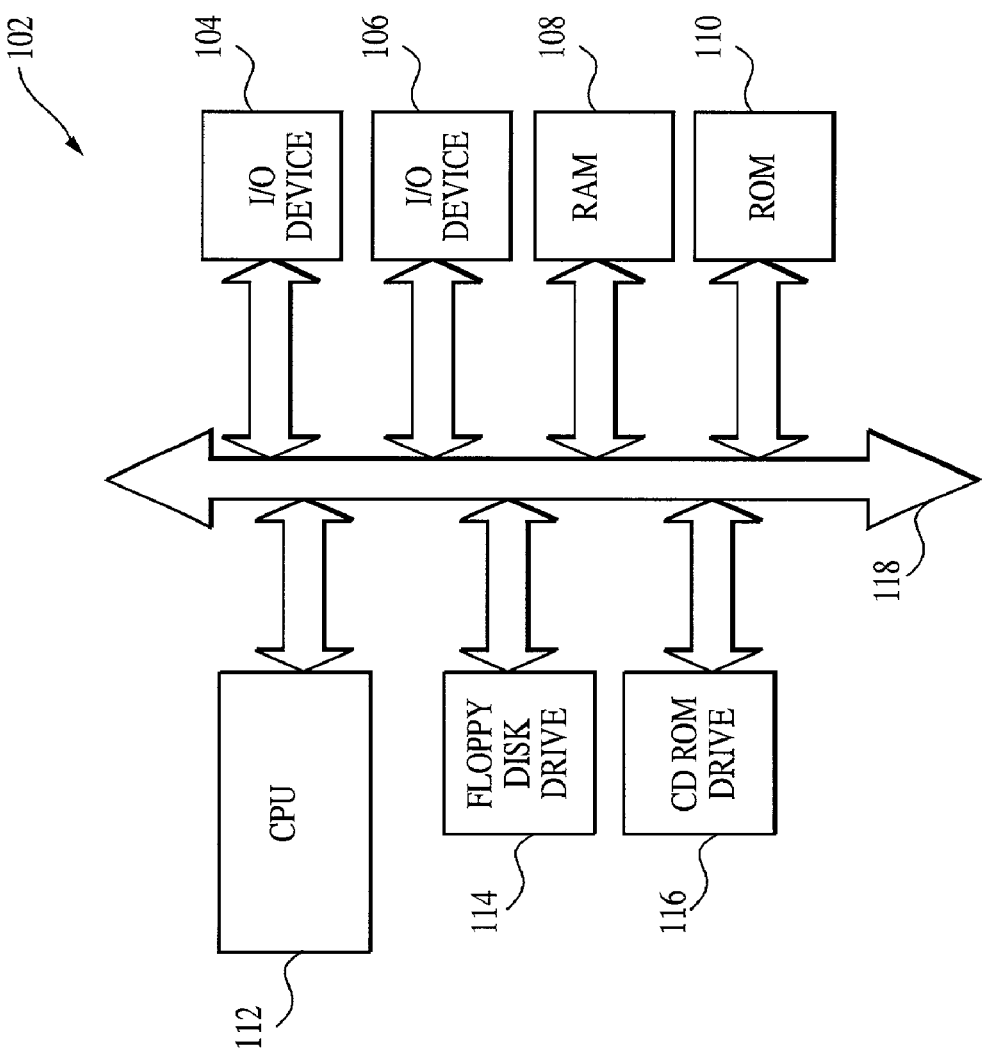
FIG. 11 is a schematic diagram of a processor system incorporating the coplanar waveguide constructed in accordance with the present invention.

FIG. 11 illustrates a processor system 102, including central processing unit (CPU) 112, RAM and ROM memory devices 108, 110, input/output (I/O) devices 104, 106, floppy disk drive 114 and CD ROM drive 116. All of the above components communicate with each other over one or more bus systems 118. One or more of the central processing unit (CPU) 112, RAM and ROM memory devices 108, 110 are fabricated on silicon substrate 12 with coplanar waveguides, such as the coplanar waveguides 100, 200 (FIGS. 9–10) formed in accordance with methods of the present invention.

Although the invention has been described above in connection with exemplary embodiments, it is apparent that many modifications and substitutions can be made without departing from the spirit or scope of the invention. Accordingly, the invention is not to be considered as limited by the foregoing description, but is only limited by the scope of the appended claims.

What is claimed as new and desired to be protected by Letters Patent of the United States is:

1. A method of forming a coplanar waveguide comprising the acts of:
   depositing an insulating material on a substrate;
   forming a signal conductor line over said insulating material;
   forming two longitudinal ground conductor planes over said substrate and on opposing sides of said signal conductor line, said ground conductor planes being spaced from said signal conductor line, wherein the acts of forming said signal conductor line and at least one of said ground conductor planes further comprise forming a barrier layer over said insulating layer and depositing a conductive material on top of said barrier layer; and
   subsequently etching said substrate to form a trench in said substrate in an area between at least one of said ground conductor planes and said signal conductor line.

2. The method of claim 1, wherein said insulating layer is an oxide layer.

3. The method of claim 1, wherein said conductive material comprises copper.

4. The method of claim 1, wherein said conductive material is deposited by thermal evaporation.

5. A method of forming a coplanar waveguide comprising the acts of:
   depositing an oxide layer on said substrate;
   depositing a barrier layer on said oxide layer;
   forming a signal conductor line over a substrate;
   forming at least one longitudinal ground conductor plane over said substrate and on a side of said signal conductor line, said ground conductor plane being spaced from said signal conductor line, wherein the acts of forming said signal conductor line and said ground conductor plane comprise depositing a conductive material on top of said barrier layer; and
   subsequently forming a trench in said substrate in an area between said at least one ground conductor plane and said signal conductor line.

6. The method of claim 5, wherein said conductive material is a metal layer, said method further comprising forming a silicide layer on sidewalls of said metal layer.

7. The method of claim 6, wherein said metal layer is exposed to silane to form said silicide layer.

8. The method of claim 7, wherein said metal layer is exposed to silane at about 300° C. to form said silicide layer.

9. The method of claim 5, wherein said barrier layer is deposited to a thickness of about 50 Angstroms to about 100 Angstroms.

10. The method of claim 5, wherein said barrier layer comprises TiN.

11. A method of forming a coplanar waveguide comprising the acts of:
   forming a signal conductor line over a substrate;
   forming at least one longitudinal ground conductor plane over said substrate and on a side of said signal conductor line, said ground conductor plane being spaced from said signal conductor line;
   depositing an oxide layer on said substrate to a thickness of about 200 Angstroms to about 300 Angstroms, wherein the acts of forming said signal conductor line and said ground conductor plane comprise depositing a conductive material on top of said oxide layer; and
   subsequently forming a trench in said substrate in an area between said at least one ground conductor plane and said signal conductor line.

12. A method of forming a coplanar waveguide comprising the acts of:
   depositing an insulating layer on said substrate;
   forming a signal conductor line over a substrate;
   forming at least one longitudinal ground conductor plane over said substrate and on a side of said signal conductor line, said ground conductor plane being spaced from said signal conductor line, wherein the acts of forming said signal conductor line and said ground conductor plane comprise depositing a conductive material on top of said insulating layer to a thickness of about 100,000 Angstroms to about 200,000 Angstroms; and
   subsequently forming a trench in said substrate in an area between said at least one ground conductor plane and said signal conductor line.

13. A method of forming a coplanar waveguide comprising the acts of:
   forming a signal conductor line over a substrate;
   forming at least one longitudinal ground conductor plane over said substrate and on a side of said signal conductor line, said ground conductor plane being spaced from said signal conductor line; and
   subsequently etching a trench to a depth of about 100,000 Angstroms to about 200,000 Angstroms in said substrate in an area between said at least one ground conductor plane and said signal conductor line.

14. A method of forming a coplanar waveguide comprising the acts of:
   forming a signal conductor line over a substrate;
   forming at least one longitudinal ground conductor plane over said substrate and on a side of said signal conductor line, said ground conductor plane being spaced from said signal conductor line; and
   subsequently etching a trench at a rate of about 2.2 µm/min in said substrate in an area between said at least one ground conductor plane and said signal conductor line.

15. A method of forming a coplanar waveguide comprising the acts of:
   forming a signal conductor line over a substrate;
   forming at least one longitudinal ground conductor plane over said substrate and on a side of said signal conductor line, said ground conductor plane being spaced from said signal conductor line by about 150,000 Angstroms to about 200,000 Angstroms; and
   subsequently forming a trench in said substrate in an area between said at least one ground conductor plane and said signal conductor line.

16. A method of forming a coplanar waveguide comprising the acts of:
   forming a signal conductor line over a substrate, wherein said signal conductor line has a width of about 250,000 Angstroms to about 350,000 Angstroms;
   forming at least one longitudinal ground conductor plane over said substrate and on a side of said signal conductor line, said ground conductor plane being spaced from said signal conductor line; and
   subsequently forming a trench in said substrate in an area between said at least one ground conductor plane and said signal conductor line.

17. A method of forming a coplanar waveguide comprising the acts of:
   forming a signal conductor line over a substrate;
   forming at least one longitudinal ground conductor plane over said substrate and on a side of said signal conductor line, said ground conductor plane being spaced from said signal conductor line, wherein said ground conductor planes and signal conductor line have a thickness of about 100,000 Angstroms to about 200,000 Angstroms; and
   subsequently forming a trench in said substrate in an area between said at least one ground conductor plane and said signal conductor line.

18. A method of forming a coplanar waveguide comprising the acts of:
   forming a signal conductor line over a silicon substrate;
   forming at least one longitudinal ground conductor plane over said substrate and on a side of said signal conductor line, said ground conductor plane being spaced from said signal conductor line; and
   subsequently forming at least one trench in said silicon substrate in an area between said at least one ground conductor plane and said signal conductor line, said at least one trench having a depth of about 100,000 Angstroms to about 200,000 Angstroms and a width of about 100,000 Angstroms to about 150,000 Angstroms.

19. The method of claim 18, further comprising depositing an oxide layer on said silicon substrate, wherein the acts of forming said signal conductor line and said ground conductor plane further comprise depositing a copper layer on top of said oxide layer.

20. The method of claim 19 further comprising depositing a barrier layer on said oxide layer before depositing said copper layer.

21. The method of claim 20, wherein said barrier layer is deposited to a thickness of about 50 Angstroms to about 100 Angstroms.

22. The method of claim 20, wherein said barrier layer comprises TiN.

23. The method of claim 19 further comprising forming a silicide layer on sidewalls of said copper layer.

24. The method of claim 23, wherein said copper layer is exposed to silane to form said silicide layer.

25. The method of claim 24, wherein said copper layer is exposed to silane at about 300° C. to form said silicide layer.

26. The method of claim 19, wherein said oxide layer is deposited to a thickness of about 200 Angstroms to about 300 Angstroms.

27. The method of claim 19, wherein said copper layer is deposited to a thickness of about 100,000 Angstroms to about 200,000 Angstroms.

28. The method of claim 18, wherein said ground conductor plane is spaced from said signal conductor line by about 150,000 Angstroms to about 200,000 Angstroms.

29. The method of claim 18, wherein said signal conductor line has a width of about 250,000 Angstroms to about 350,000 Angstroms.

30. The method of claim 18, wherein said ground conductor planes and signal conductor line has a thickness of about 100,000 Angstroms to about 200,000 Angstroms.

31. A method of forming a coplanar waveguide comprising the acts of:
- forming a signal conductor line over a silicon substrate;
- forming at least one longitudinal ground conductor plane over said substrate and on a side of said signal conductor line, said ground conductor plane being spaced from said signal conductor line; and
- forming at least one trench in said silicon substrate by use of an isotropic etching process in an area between said at least one ground conductor plane and said signal conductor line, said at least one trench having a radius of about 50,000 Angstroms to about 100,000 Angstroms.

32. The method of claim 31, further comprising depositing an oxide layer on said silicon substrate, wherein the acts of forming said signal conductor line and said ground conductor plane further comprise depositing a copper layer on top of said oxide layer.

33. The method of claim 32 further comprising depositing a barrier layer on said oxide layer before depositing said copper layer.

34. The method of claim 33 further comprising forming a silicide layer on sidewalls of said copper layer.

35. The method of claim 34, wherein said copper layer is exposed to silane to form said silicide layer.

36. The method of claim 35, wherein said copper layer is exposed to silane at about 300° C. to form said silicide layer.

37. The method of claim 33, wherein said barrier layer is deposited to a thickness of about 50 Angstroms to about 100 Angstroms.

38. The method of claim 33, wherein said barrier layer comprises TiN.

39. The method of claim 32, wherein said oxide layer is deposited to a thickness of about 200 Angstroms to about 300 Angstroms.

40. The method of claim 32, wherein said copper layer is deposited to a thickness of about 100,000 Angstroms to about 200,000 Angstroms.

41. The method of claim 31, wherein said ground conductor plane is spaced from said signal conductor line by about 150,000 Angstroms to about 200,000 Angstroms.

42. The method of claim 31, wherein said signal conductor line has a width of about 250,000 Angstroms to about 350,000 Angstroms.

43. The method of claim 31, wherein said ground conductor planes and signal conductor line has a thickness of about 100,000 Angstroms to about 200,000 Angstroms.

44. A method of forming a coplanar waveguide comprising the acts of:
- forming an insulating layer over a silicon substrate;
- forming a photoresist layer over said insulating layer;
- patterning said photoresist layer to provide a plurality of openings, said openings being spaced apart and exposing said insulating layer;
- forming a barrier layer at a bottom of said openings in said photoresist layer over any exposed portions of said insulating layer;
- partially filling said openings with a conductive material to form a conductive layer;
- forming a silicon insulating layer over said conductive layer to completely fill said openings;
- removing remaining portions of said photoresist;
- forming a passivation layer on exposed sidewalls of said conductive layer; and
- forming a plurality of trenches in said silicon substrate and between said openings.

45. The method of claim 44, wherein said insulating layer is an oxide layer.

46. The method of claim 44, wherein said openings have a width of 250,000 Angstroms to about 350,000 Angstroms.

47. The method of claim 44, wherein said barrier layer comprises a bonding material selected from the group consisting of tantalum, titanium, titanium-tungsten, titanium nitride and chromium.

48. The method of claim 44, wherein said conductive layer comprises copper.

49. The method of claim 44, wherein said conductive layer is formed to a thickness of about 100,000 Angstroms to about 200,000 Angstroms.

50. The method of claim 44, wherein said silicon oxide layer is deposited by thermal evaporation at or near room temperature.

51. The method of claim 44, wherein said silicon oxide layer is formed to a thickness of about 5,000 Angstroms to about 10,000 Angstroms.

52. The method of claim 44, wherein said passivation layer is formed to a thickness of about 50 Angstroms to about 100 Angstroms.

53. The method of claim 44, wherein said passivation layer is a silicide layer.

54. The method of claim 44, wherein said trenches have a depth of about 100,000 Angstroms to about 200,000 Angstroms and a width of about 150,000 Angstroms.

55. The method of claim 44, wherein said trenches are formed by reactive ion etching using a deep trench etcher at an etch rate of about 2.2 μm/min.

56. The method of claim 44, wherein said trenches are formed by an isotropic etching process.

57. The method of claim 44, wherein said trenches have a circular shape with a radius of about 50,000 Angstroms to about 100,000 Angstroms.

58. A method of forming a coplanar waveguide comprising the acts of:
- depositing an oxide layer over a silicon substrate;
- forming a photoresist layer over said oxide layer;
- patterning said photoresist layer to provide a plurality of openings, said openings being spaced apart by about 150,000 Angstroms to about 200,000 Angstroms and exposing said oxide layer;
- depositing a barrier layer at a bottom of said openings over any exposed portions of said oxide layer, wherein said barrier layer comprises a bonding material selected from the group consisting of tantalum, titanium, titanium-tungsten, titanium nitride and chromium;
- depositing a copper layer by thermal evaporation in said partially filled openings to partially fill said openings;
- forming a silicon oxide layer over said partially filled openings to completely fill said openings;
- removing remaining portions of said photoresist to form a signal copper line;
- forming a passivation layer on exposed sidewalls of said signal copper line; and
- etching said silicon substrate between said openings and to a depth of about 100,000 Angstroms to about 200,000 Angstroms to form a plurality of trenches.

59. The method of claim 58, wherein said copper layer has a thickness of about 100,000 Angstroms to about 200,000 Angstroms.

60. The method of claim 58, wherein said copper layer is exposed to silane to form a silicide layer on sidewalls of said copper layer.

61. The method of claim 60, wherein said copper layer is exposed to silane at 300° C. to form said silicide layer.

62. A method of forming a coplanar waveguide comprising the acts of:

forming an insulating layer over a silicon substrate;

forming a photoresist layer over said insulating layer;

patterning said photoresist layer to provide a plurality of openings, said openings being spaced apart and exposing said insulating layer;

forming a barrier layer at a bottom of said openings in said photoresist layer over any exposed portions of said insulating layer;

forming a signal conductor line over said substrate;

forming at least one longitudinal ground conductor plane over said substrate and on opposing sides of said signal conductor line, wherein the acts of forming said signal conductor line and said at least one ground plane comprise partially filling said openings with a conductive material to form a conductive layer;

forming a silicon insulating layer over said conductive layer to completely fill said openings;

removing remaining portions of said photoresist;

forming a passivation layer on exposed sidewalls of said conductive layer; and subsequently forming a trench in said substrate in an area between said at least one ground conductor plane and said signal conductor line.

* * * * *